(12) United States Patent
Leighton et al.

(10) Patent No.: US 6,236,246 B1
(45) Date of Patent: May 22, 2001

(54) VOLTAGE-MODE BOOSTING CIRCUIT FOR WRITE DRIVER

(75) Inventors: John D. Leighton, Anoka; Tuan V. Ngo, Eden Prairie, both of MN (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/432,951

(22) Filed: Nov. 3, 1999

Related U.S. Application Data

(60) Provisional application No. 60/144,511, filed on Jul. 19, 1999.

(51) Int. Cl.[7] .............................. H03B 1/00; H03K 3/00
(52) U.S. Cl. ............................. 327/110; 327/424
(58) Field of Search ..................... 327/108, 109, 327/110, 423, 424, 448, 508; 363/58, 63; 360/46, 67, 68

(56) References Cited

U.S. PATENT DOCUMENTS

| | | | | |
|---|---|---|---|---|
| 3,731,004 | * | 5/1973 | Cowpland et al. | 327/110 |
| 3,770,986 | * | 11/1973 | Drehle | 327/110 |
| 5,751,171 | * | 5/1998 | Ngo | 327/110 |
| 5,757,215 | * | 5/1998 | Schuelke et al. | 327/110 |
| 5,894,237 | * | 4/1999 | Brannon et al. | 327/110 |
| 5,990,710 | * | 11/1999 | Ngo et al. | 327/110 |

\* cited by examiner

Primary Examiner—My-Trang Nu Ton
(74) Attorney, Agent, or Firm—Kinney & Lange, P.A.

(57) ABSTRACT

A voltage boost circuit for a write driver includes first and second semiconductor devices, such as Schottky diodes, coupled to respective first and second nodes to conduct write current through respective first or second current switches of the write driver when a forward voltage across the respective first or second semiconductor device exceeds a design voltage. The first and second current switches are responsive to respective complementary first and second input signals to direct write current in opposite directions through the winding between the first and second nodes. First and second storage devices are connected to the respective first and second semiconductor devices, and first and second buffers are responsive to a first state of the respective first and second input signals to operate the respective first or second storage device to increase the forward voltage across the respective first or second semiconductor device. Preferably, each buffer is responsive to a second state of the respective input signal to operate the respective storage device to decrease the forward voltage across the respective semiconductor device.

22 Claims, 2 Drawing Sheets

VOLTAGE-MODE BOOSTING CIRCUIT FOR WRITE DRIVER

CROSS-REFERENCE TO RELATED APPLICATION

This application claims the benefit of Provisional Application No. 60/144,511 filed Jul. 19, 1999 for "Voltage-Mode Boosting Circuit for Write Driver" by John D. Leighton and Tuan V. Ngo.

BACKGROUND OF THE INVENTION

Write drivers for inductive write heads of the magnetic disc drive are employed to provide write current to the head. These inductive heads record data on the magnetic media by selective reversal of magnetic flux caused by a reversal of the direction of current through the write head winding. The write current is reversed by a command from an input signal representing data to be recorded. However, the current reversal generates voltage differences across the head during the reversal period, thereby requiring the voltage to recover to a nominal level to again achieve a steady-state flow of current in the opposite direction after the reversal. The voltage fluctuations cause delay in achieving steady-state current conditions, and also cause overshoot or "ringing" of the current waveform.

Numerous techniques have been employed to address the problem of overshoot, ringing and delays in reaching steady-state conditions. The present invention is directed to a voltage boost circuit that boosts the voltage at the nodes on opposite sides of the head, the boosting occurring in either positively or negatively, or both, to reduce delays in achieving steady-state current conditions and to reduce overshoot or ringing.

BRIEF SUMMARY OF THE INVENTION

A voltage boost circuit is provided for a write driver. The write driver has first and second nodes for connection to opposite sides of a write head winding. The voltage boost circuit includes a first and semiconductor devices, such as Schottky diodes, coupled to respective first and second nodes to conduct write current through respective first or second current switches of the write driver when a forward voltage across the respective first or second semiconductor device exceeds a design voltage. The first and second current switches are responsive to respective complementary first and second input signals to direct write current in opposite directions through the winding between the first and second nodes. First and second storage devices are connected to the respective first and second semiconductor devices, and first and second buffers are responsive to a first state of the respective first and second input signals to operate the respective first or second storage device to increase the forward voltage across the respective first or second semiconductor device.

In a preferred form of the voltage boost circuit, the first and second buffers are responsive to a second state of the respective first and second input signals to operate the respective first or second storage device to decrease the forward voltage across the respective first or second semiconductor device.

In an optional form of the invention, the write driver includes third and fourth current switches coupled to the first and second nodes to conduct write current through the write head winding. The voltage boost circuit additionally includes third and fourth semiconductor devices, such as Schottky diodes, coupled to the respective first and second nodes to conduct write current through the respective third or fourth current switch when a forward voltage across the respective third or fourth semiconductor device exceeds a second design voltage. Third and fourth storage devices are connected to respective third and fourth semiconductor device. The first buffer is responsive to the first state of the first input signal to operate the third storage device to decrease the forward voltage across the third semiconductor device, and the second buffer is responsive to the first state of the second input signal to operate the fourth storage device to decrease the forward voltage across the fourth semiconductor device.

In a preferred form of this optional version of the voltage boost circuit, the first and second buffers are responsive to the second state of the respective first and second input signals to operate the respective third or fourth storage device to increase the forward voltage across the respective third or fourth semiconductor device.

DETAILED DESCRIPTION

Figure 1:
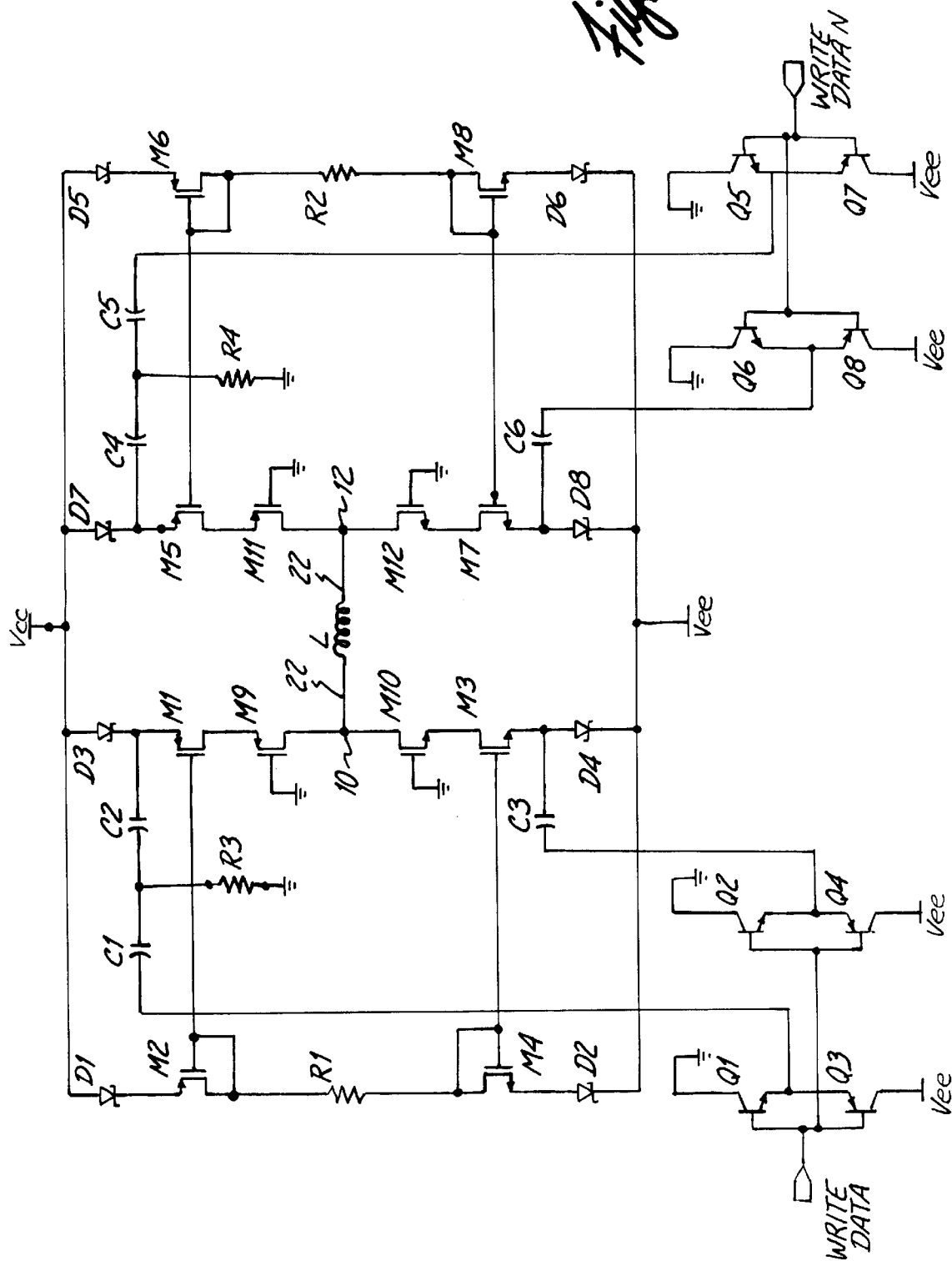
FIG. 1 is a circuit diagram of a voltage-mode boosting circuit illustrating the principles of the present invention.

FIG. 1 is a circuit diagram illustrating the principles of the present invention. A write driver comprises an H-switch consisting of current switches formed by MOSFETs M1, M3, M5 and M7 which are respectively driven by floating current sources consisting of Schottky diodes D1, D2, D5 and D6, resistors R1 and R2 and current mirror driver MOSFETs M2, M4, M6 and M8. The coil L of an inductive write head is connected by a transmission line 22, such as a flexible conductor cable, between nodes 10 and 12 of the H-switch. The circuit will be described where Vcc and Vee are DC voltage sources of +5 volts and −5 volts, respectively. The voltage-mode boosting circuit according to the present invention will swing the voltages of the driver outputs at nodes 10 and 12 to greater than the supplies, namely between Vcc plus 0.5 volts (+5.5v) and Vee minus 0.5 volts (−5.5v). To prevent breakdown of switches M1, M3, M5 and M7 due to large voltage swings (10 volts or more) at their sources, MOSFETs M9, M10, M11 and M12 are connected between a node 10 or 12 and a respective one of current switches M1, M3, M5 and M7, with the gates of MOSFETs M9–M12 being connected to ground. The anodes of Schottky diodes D3 and D7 are connected to source Vcc and the cathodes of diodes D3 and D7 are connected to the drains of respective MOSFETs M1 and M5. Similarly, the anodes of Schottky diodes D4 and D8 are connected to the drains of respective MOSFETs M4 and M8 and their cathodes are connected to source Vee.

The voltage-mode boosting circuit of the present invention comprises capacitors C1–C6 and transistors Q1–Q8. The Write_Data input signal is connected to the bases of NPN transistors Q1 and Q2 and to the bases of PNP transistors Q3 and Q4. The collectors of transistors Q1 and Q2 are connected to ground and the collectors of transistors Q3 and Q4 are connected to source Vee. The emitters of transistors Q1 and Q3 are connected together and to one side of capacitor C1 which is connected in series with capacitor C2 to the cathode of Schottky diode D3. The mid-point between capacitor C1 and C2 is connected to ground through high impedance (e.g., 20 KΩ) resistor R3. The emitters of transistors Q2 and Q4 are connected together and through capacitor C3 to the anode of Schottky diode D4.

Similarly, the Write_Data_N input is connected to the bases of NPN transistors Q5 and Q6 and PNP transistors Q7 and Q8. The collectors of transistors Q5 and Q6 are connected to ground and the connectors of collectors Q7 and Q8 are connected to Vee. The emitters of transistors Q5 and Q7 are connected together and through serial capacitors C5 and C4 to the cathode of Schottky diode D7. The mid-point between capacitors C4 and C5 are connected through high impedance (e.g., 20 KΩ) resistor R4 to ground. Likewise, the emitters of transistors Q6 and Q7 are connected together and through capacitor C6 to the anode of Schottky diode D8. The Write_Data and Write_Data_N inputs are complementary signals such that when one is in a high state the other is in a low state, and vice versa.

When Write_Data is switched from low (−5 volts) to high (0 volts) and Write_Data_N is switched from high (0 volts) to low (−5 volts), buffer transistors Q1, Q2, Q7 and Q8 will turn on very hard, producing about 15 milliamps of transient current. When transistors Q1 and Q2 turn on, the outputs at the emitters of transistors Q1 and Q2 switch from a low level to a high level. More particularly, prior to the switching of Write_Data from low to high, the low state of Write_Data operated transistors Q3 and Q4 to place a low voltage level at the emitters of Q1–Q4 equal to Vee plus the base-emitter drop of transistors Q3 and Q4 (Vee+Vbe). When Write_Data switches state to high, the voltage at the emitters rises to ground minus the base-emitter drop of transistors Q1 and Q2 (0 volts−Vbe). This energy is transferred to capacitors C1 and C2 to boost the cathode of Schottky diode D3 to above the positive supply (above Vcc), therefore Schottky diode D3 is in the reverse bias mode. Similarly, the energy at the emitters of transistors Q2 and Q4 is transferred to capacitor C3 to hard bias Schottky diode D4 in the forward direction. As a result, the voltage at node 10 is quickly boosted to above the positive supply.

Similarly, prior to the switching of Write_Data_N from high to low, the high state of Write_Data_N operated transistors Q5 and Q6 to place a high voltage level (0 volts−Vbe) at the emitters of Q5–Q8. When Write_Data_N switches state to low, the voltage at the emitters drops to Vee+Vbe. This energy is transferred to capacitor C6 to boost the anode of Schottky diode D8 to below the negative supply (below Vee). Similarly, the energy at the emitters of transistors Q5 and Q6 is transferred to capacitors C4 and C5 to bias Schottky diode D7 in the reverse direction. As a result, the voltage at node 12 is quickly boosted to below the negative supply. As a result, a voltage appears across winding L of more than the sum of the two supplies.

Figure 2:
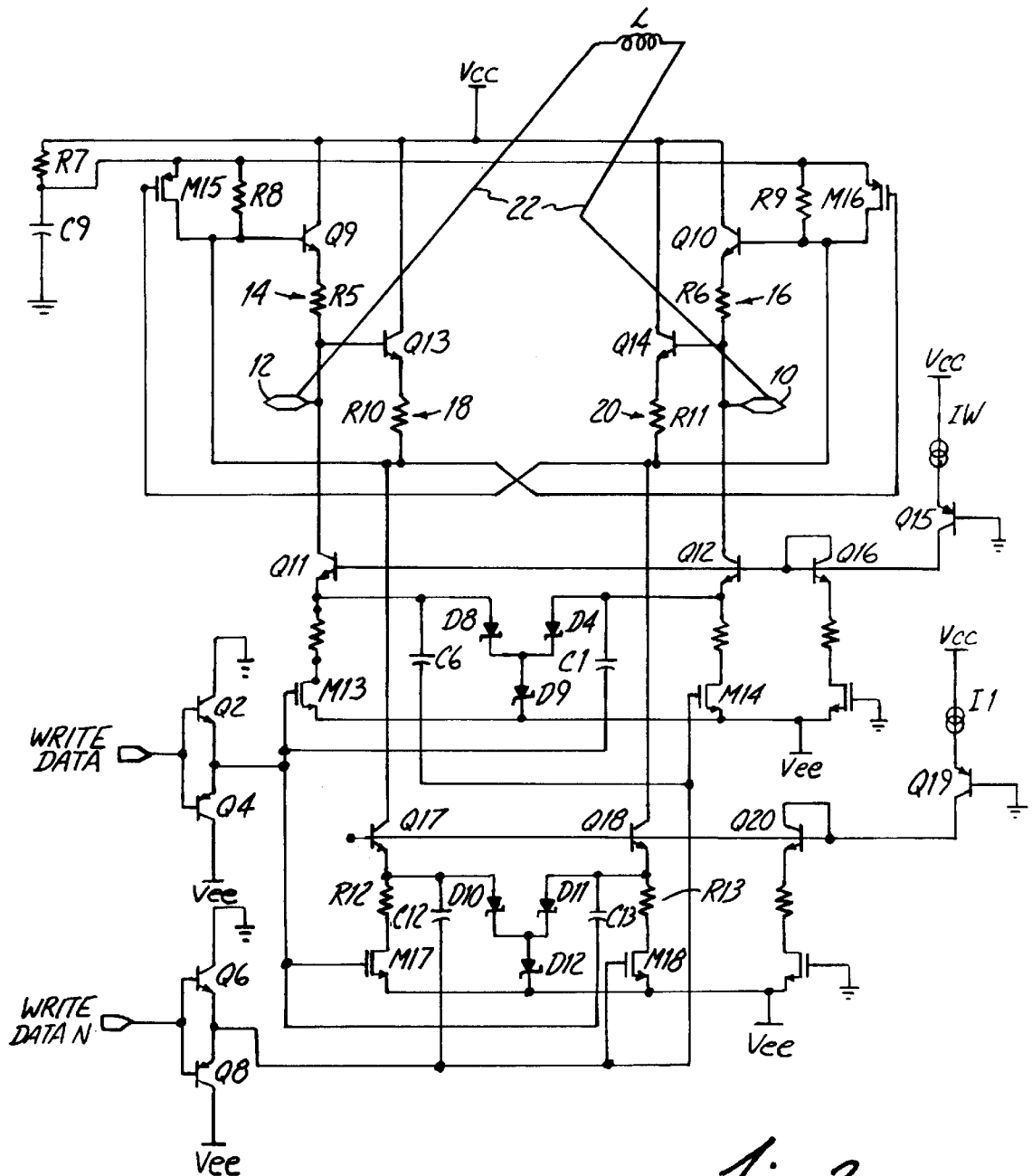
FIG. 2 is a circuit diagram of a write driver incorporating a voltage mode boosting circuit according to one embodiment of the present invention.

FIG. 2 illustrates application of the voltage-mode boosting circuit according to present invention to a current mode write driver. The write driver comprises an H-switch consisting of upper NPN transistors Q9 and Q10 and lower NPN transistors Q11 and Q12 coupled with MOSFETs M13 and M14, respectively. Resistor R5 is coupled between the emitter of transistor Q9 and node 12 and resistor R6 is coupled between emitter of transistor Q10 and node 10. The circuits of resistors R5 and R6 provide impedance matching to the load connected to nodes 10 and 12, as described in Application No. (V44.12-0131 filed on even date herewith, for "Write Driver Load Impedance Matching Circuit with Shorting During Switching to Minimize Undershoot" by Tuan V. Ngo and assigned to the same assignee as the present application. A source of write current IW is input through transistor Q15 and mirrored by current mirror generator Q16 to transistors Q11 and Q12.

An upper H-switch control circuit is composed of NPN transistors Q13 and Q14, MOSFETs M15 and M16, resistors R7, R8, R9, R10 and R11 and capacitor C9. The bases of transistors Q13 and Q14 are connected to respective nodes 12 and 10, and their emitters are connected through resistors R10 and R11 to the sources of MOSFETs M15 and M16, respectively, and to the gates of MOSFETs M16 and M15, respectively. Resistors R8 and R9 are connected across MOSFETs M15 and M16, and the sources of MOSFETs M15 and M16 are connected to the bases of transistors Q9 and Q10. The drains of MOSFETs M15 and M16 are connected to the junction between capacitor C9 and resistor R7, the opposite side of resistor R7 being connected to Vcc and the opposite side of capacitor C9 being connected to Vee. A source of control current I1 is input through transistor Q19 and mirrored by current mirror generator Q20 to transistors Q17 and Q18. Transistors Q17 and Q18 have their collectors coupled through respective resistors R10 and R11 to the emitters of transistors Q13 and Q14 of the upper H-switch control, and their emitters are coupled through resistors R12 and R13 to MOSFETs M17 and M18. The gate of MOSFET M17 is coupled to the buffer consisting of transistors Q2 and Q4 and the gate of MOSFET M18 is coupled to the buffer of transistors Q6 and Q8. When MOSFET M17 is conducting, current is mirrored through transistor Q17 and when MOSFET M18 is operated current is mirrored through transistor Q18.

In operation of the circuit illustrated in FIG. 2, when MOSFET M13 and transistor Q10 are operated to conduction, write current IW mirrored into transistor Q11 flows through the winding connected to nodes 10 and 12 from source Vcc, through transistor Q10, through the winding in the direction from node 10 to node 12, through transistor mirror Q11 and MOSFET M13 to source Vee. Conversely, when MOSFET M14 and transistor Q9 are operated to conduction, write current mirrored into transistor Q12 flows from source Vcc through transistor Q9, winding L in the direction from node 12 to node 10, through transistor mirror Q12 and MOSFET M14 to source Vee. The gates of MOSFETs M13 and M14 are connected to different ones of the buffers consisting of transistors Q2 and Q4 and Q6 and Q8. Likewise, the gates of MOSFETs M17 and M18 are connected to opposite ones of the buffers of transistors Q2 and Q4 and transistors Q6 and Q8 to operate the upper H-switch control to effectuate operation of the respective transistors Q9 and Q10.

The operation of the upper H-switch control is more fully explained in Application No. 09/292,502, filed on Apr. 15, 1999, for "Write Driver Circuit Having Programmable Overshoot and Undershoot" by John J. Price Jr and Donald J. Schulte and assigned to the same assignee as the present application.

The configuration of the voltage mode boosting circuit illustrated in FIG. 2 is quite similar to that illustrated in FIG. 1. The Write_Data signal is coupled through the buffer circuit comprising transistors Q2 and Q4 and through capacitor C1 to the anode of Schottky diode D4, and the Write_Data_N signal is coupled through the buffer comprising transistors Q6 and Q8 and through capacitor C6 to the anode of Schottky diode D8. The cathodes of Schottky diodes D4 and D8 are connected through Schottky diode D9 to source Vee. In this manner, one or the other of nodes 10 and 12 is rapidly driven by the boost voltage as described above in connection with FIG. 1.

A second boost circuit provides rapid operation of the upper H-switch control by rapidly boosting the voltage at the junction of the emitter transistor Q13, the base of transistor Q9 and the gate of MOSFET M16, or rapidly boosting the voltage at the junction of the emitter of transistor Q14, the base of transistors Q11 and the gate of MOSFET M16. This second boost circuit consists of capacitors C12 and C13 and Schottky diodes D10, D11 and D12 configured in a manner similar to the boost circuit of capacitors C1 and C6 and Schottky diodes D4, D8 and D9. This second boost circuit is coupled to the buffers consisting of transistors Q2 and Q4 and transistors Q6 and Q8. When Write_Data is switched from low (−5 volts) to high (0 volts) and Write_Data_N is switched from high (0 volts) to low (−5 volts), buffer transistors Q2 and Q8 will turn on very hard, producing about 15 milliamps of transient current. When transistor Q2 turns on, its emitter switches from a low level to a high level. This energy is transferred to capacitors C1 and C13 to boost the cathode potential voltage of Schottky diodes D4 and D11, thereby hard biasing Schottky diodes D4 and D9 and Schottky diodes D11 and D12 in the forward direction. As a result, the voltage at node 10 is quickly boosted to 5.5 volts (Vcc plus the forward voltage of Schottky diode D3), as is the voltage at the base of transistor Q10.

Likewise, when transistor Q8 turns on, its emitter switches from a high to a low level to boost the cathode potential of Schottky diodes D8 and D10 negatively thereby hard biasing Schottky diodes D8 and D9 and Schottky diodes D10 and D12 in the reverse direction to rapidly drop the voltage at node 12 and to rapidly turn off transistor Q9. The rapid operation of transistors Q9 and Q10 and the rapid voltage boost at the nodes assures rapid switching of the H-switch and reversal of write current in the write head coil L.

The embodiment illustrated in FIG. 2 employs a voltage boost circuit described in connection with the voltage boost circuit shown in FIG. 1 comprising the buffers of transistors Q2/Q4 and Q6/Q8 and the capacitors associated with the Schottky diodes connected to source Vee. Clearly, the other voltage boost circuit shown in FIG. 1 (comprising the buffers of transistors Q1/Q3 and Q5/Q7 and the capacitors associated with the Schottky diodes connected to source Vcc) could be used in place of, or in addition to, the voltage boost circuit in FIG. 2 without departing from the spirit of the invention.

Although the present invention has been described with reference to preferred embodiments, workers skilled in the art will recognize that changes may be made in form and detail without departing from the spirit and scope of the invention. Particularly, while the invention is described in the form of discrete devices, it is recognized that the circuit is preferably reduced to practice in the form of an integrated circuit (IC). Therefore, terms such as "device" and the like should be construed in their broadest contexts to include portions of ICs that are conveniently described as functional components, as well as discrete devices.

What is claimed is:

1. In a write driver having first and second nodes for connection to opposite sides of a winding of a write head and at least a first current switch connected to the first node and a second current switch connected to the second node, a first input responsive to a first input signal for operating the first switch to direct write current through the winding from the first node to the second node, and a second input responsive to a second input signal for operating the second switch to direct write current through the winding from the second node to the first node, the first and second input signals being complementary between first and second states, the improvement of a voltage boost circuit comprising:

a first semiconductor device coupled to the first node, the first semiconductor device conducting write current when a forward voltage across the first semiconductor device exceeds a design voltage;

a first storage device connected to the first semiconductor device for storing a charge;

a second semiconductor device coupled to the second node, the second semiconductor device conducting write current when a forward voltage across the second semiconductor device exceeds the design voltage;

a second storage device connected to the second semiconductor device for storing a charge;

a first buffer responsive to the first state of the first input signal to operate the first storage device to increase the forward voltage across the first semiconductor device; and a second buffer responsive to the first state of the second input signal to operate the second storage device to increase the forward voltage across the second semiconductor device.

2. In the write driver according to claim 1, wherein the first buffer is responsive to the second state of the first input signal to operate the first storage device to decrease the forward voltage across the first semiconductor device, and the second buffer is responsive to the second state of the second input signal to operate the second storage device to decrease the forward voltage across the second semiconductor device.

3. In the write driver according to claim 1, wherein first and second current switches are coupled between a first source of potential and the respective first and second nodes, the write driver further including a third current switch coupled between the first node and a second source of potential and a fourth current switch coupled between the second node and the second source of potential, the first input being responsive to the first input signal for operating the first and fourth switches to direct write current from the first source of potential through the winding from the first node to the second node to the second source of potential, and the second input being responsive to the second input signal for operating the second and third switches to direct write current from the first source of potential through the winding from the second node to the first node to the second source of potential, the voltage boost circuit further including:

a third semiconductor device coupled to the first node, the third semiconductor device conducting write current when a forward voltage across the third semiconductor device exceeds a second design voltage;

a third storage device connected to the third semiconductor device for storing a charge;

a fourth semiconductor device coupled to the second node, the fourth semiconductor device conducting write current when a forward voltage across the fourth semiconductor device exceeds the second design voltage;

a fourth storage device connected to the fourth semiconductor device for storing a charge;

the first buffer being responsive to the first state of the first input signal to operate the third storage device to decrease the forward voltage across the third semiconductor device; and the second buffer being responsive to the first state of the second input signal to operate the fourth storage device to decrease the forward voltage across the fourth semiconductor device.

4. In the write driver according to claim 3, wherein
the first buffer is responsive to the second state of the first input signal to operate the third storage device to increase the forward voltage across the third semiconductor device, and
the second buffer is responsive to the second state of the second input signal to operate the fourth storage device to increase the forward voltage across the fourth semiconductor device.

5. In the write driver according to claim 4, wherein
the first buffer is responsive to the second state of the first input signal to operate the first storage device to decrease the forward voltage across the first semiconductor device, and
the second buffer is responsive to the second state of the second input signal to operate the second storage device to decrease the forward voltage across the second semiconductor device.

6. In the write driver according to claim 3, wherein
the first buffer is responsive to the second state of the first input signal to operate the first storage device to decrease the forward voltage across the first semiconductor device, and
the second buffer is responsive to the second state of the second input signal to operate the second storage device to decrease the forward voltage across the second semiconductor device.

7. In the write driver according to claim 3, wherein the first semiconductor device is a first Schottky diode having an anode coupled to a power source of positive voltage and a cathode coupled to the first node, the second semiconductor device is a second Schottky diode having an anode coupled to the power source of positive voltage and a cathode coupled to the second node, the first storage device comprises first and second capacitors coupled in series between the cathode of the first Schottky diode and the first buffer with a junction between the first and second capacitors coupled to a source of ground potential, and the second storage device comprises third and fourth capacitors coupled in series between the cathode of the second Schottky diode and the second buffer with a junction between the third and fourth capacitors coupled to the source of ground potential.

8. In the write driver according to claim 7, wherein the third semiconductor is a third Schottky diode having an anode coupled to the first node and a cathode coupled to a power source of negative voltage, the fourth semiconductor is a fourth Schottky diode having an anode coupled to the second node and a cathode coupled to the power source of negative voltage, the third storage device comprises a fifth capacitor coupled between the anode of the third Schottky diode and the first buffer, and the fourth storage device comprises a sixth capacitor coupled between the anode of the fourth Schottky diode and the second buffer.

9. In the write driver according to claim 3, wherein the first semiconductor is a first Schottky diode having an anode coupled to the first node and a cathode coupled to a power source of negative voltage, the second semiconductor is a second Schottky diode having an anode coupled to the second node and a cathode coupled to the power source of negative voltage, the first storage device comprises a first capacitor coupled between the anode of the first Schottky diode and the first buffer, and the second storage device comprises a second capacitor coupled between the anode of the second Schottky diode and the second buffer.

10. In the write driver according to claim 1, wherein the first semiconductor device is a first Schottky diode having an anode coupled to a power source of positive voltage and a cathode coupled to the first node, the second semiconductor device is a second Schottky diode having an anode coupled to the power source of positive voltage and a cathode coupled to the second node, the first storage device comprises first and second capacitors coupled in series between the cathode of the first Schottky diode and the first buffer with a junction between the first and second capacitors coupled to a source of ground potential, and the second storage device comprises third and fourth capacitors coupled in series between the cathode of the second Schottky diode and the second buffer with a junction between the third and fourth capacitors coupled to the source of ground potential.

11. In the write driver according to claim 1, wherein the first semiconductor is a first Schottky diode having an anode coupled to the first node and a cathode coupled to a power source of negative voltage, the second semiconductor is a second Schottky diode having an anode coupled to the second node and a cathode coupled to the power source of negative voltage, the first storage device comprises a first capacitor coupled between the anode of the first Schottky diode and the first buffer, and the second storage device comprises a second capacitor coupled between the anode of the second Schottky diode and the second buffer.

12. A voltage boost circuit for a write driver having a first and second nodes for connection to opposite sides of a write head winding, the voltage boost circuit comprising:
a first semiconductor device coupled to the first node, the first semiconductor device conducting write current through a first current switch of the write driver when a forward voltage across the first semiconductor device exceeds a design voltage;
a second semiconductor device coupled to the second node, the second semiconductor device conducting write current through a second current switch of the write driver when a forward voltage across the second semiconductor device exceeds the design voltage, the first and second current switches being responsive to respective first and second input signals to direct current in opposite directions through the winding between the first and second nodes, the first and second input signals having first and second states;
a first storage device connected to the first semiconductor device for storing a charge;
a second storage device connected to the second semiconductor device for storing a charge;
a first buffer responsive to the first state of the first input signal to operate the first storage device to increase the forward voltage across the first semiconductor device; and
a second buffer responsive to the first state of the second input signal to operate the second storage device to increase the forward voltage across the second semiconductor device.

13. The voltage boost circuit according to claim 12, wherein
the first buffer is responsive to the second state of the first input signal to operate the first storage device to decrease the forward voltage across the first semiconductor device, and
the second buffer is responsive to the second state of the second input signal to operate the second storage device to decrease the forward voltage across the second semiconductor device.

14. The voltage boost circuit according to claim 12, further including:

a third semiconductor device coupled to the first node, the third semiconductor device conducting write current through a third current switch of the write driver when a forward voltage across the third semiconductor device exceeds a second design voltage;

a fourth semiconductor device coupled to the second node, the fourth semiconductor device conducting write current through a fourth current switch of the write driver when a forward voltage across the fourth semiconductor device exceeds the second design voltage, the first, second, third and fourth current switches being responsive to respective first and second input signals to direct current in opposite directions through the winding between the first and second nodes;

a third storage device connected to the third semiconductor device for storing a charge;

a fourth storage device connected to the fourth semiconductor device for storing a charge;

the first buffer being responsive to the first state of the first input signal to operate the third storage device to decrease the forward voltage across the third semiconductor device; and the second buffer being responsive to the first state of the second input signal to operate the fourth storage device to decrease the forward voltage across the fourth semiconductor device.

15. The voltage boost circuit according to claim 14, wherein the first buffer is responsive to the second state of the first input signal to operate the third storage device to increase the forward voltage across the third semiconductor device, and the second buffer is responsive to the second state of the second input signal to operate the fourth storage device to increase the forward voltage across the fourth semiconductor device.

16. The voltage boost circuit according to claim 15, wherein the first buffer is responsive to the second state of the first input signal to operate the first storage device to decrease the forward voltage across the first semiconductor device, and the second buffer is responsive to the second state of the second input signal to operate the second storage device to decrease the forward voltage across the second semiconductor device.

17. The voltage boost circuit according to claim 14, wherein the first buffer is responsive to the second state of the first input signal to operate the first storage device to decrease the forward voltage across the first semiconductor device, and the second buffer is responsive to the second state of the second input signal to operate the second storage device to decrease the forward voltage across the second semiconductor device.

18. The voltage boost circuit according to claim 14, wherein the first semiconductor device is a first Schottky diode having an anode coupled to a power source of positive voltage and a cathode coupled to the first node, the second semiconductor device is a second Schottky diode having an anode coupled to the power source of positive voltage and a cathode coupled to the second node, the first storage device comprises first and second capacitors coupled in series between the cathode of the first Schottky diode and the first buffer with a junction between the first and second capacitors coupled to a source of ground potential, and the second storage device comprises third and fourth capacitors coupled in series between the cathode of the second Schottky diode and the second buffer with a junction between the third and fourth capacitors coupled to the source of ground potential.

19. The voltage boost circuit according to claim 18, wherein the third semiconductor is a third Schottky diode having an anode coupled to the first node and a cathode coupled to a power source of negative voltage, the fourth semiconductor is a fourth Schottky diode having an anode coupled to the second node and a cathode coupled to the power source of negative voltage, the third storage device comprises a fifth capacitor coupled between the anode of the third Schottky diode and the first buffer, and the fourth storage device comprises a sixth capacitor coupled between the anode of the fourth Schottky diode and the second buffer.

20. The voltage boost circuit according to claim 14, wherein the first semiconductor is a first Schottky diode having an anode coupled to the first node and a cathode coupled to a power source of negative voltage, the second semiconductor is a second Schottky diode having an anode coupled to the second node and a cathode coupled to the power source of negative voltage, the first storage device comprises a first capacitor coupled between the anode of the first Schottky diode and the first buffer, and the second storage device comprises a second capacitor coupled between the anode of the second Schottky diode and the second buffer.

21. The voltage boost circuit according to claim 12, wherein the first semiconductor device is a first Schottky diode having an anode coupled to a power source of positive voltage and a cathode coupled to the first node, the second semiconductor device is a second Schottky diode having an anode coupled to the power source of positive voltage and a cathode coupled to the second node, the first storage device comprises first and second capacitors coupled in series between the cathode of the first Schottky diode and the first buffer with a junction between the first and second capacitors coupled to a source of ground potential, and the second storage device comprises third and fourth capacitors coupled in series between the cathode of the second Schottky diode and the second buffer with ajunction between the third and fourth capacitors coupled to the source of ground potential.

22. The voltage boost circuit according to claim 12, wherein the first semiconductor is a first Schottky diode having an anode coupled to the first node and a cathode coupled to a power source of negative voltage, the second semiconductor is a second Schottky diode having an anode coupled to the second node and a cathode coupled to the power source of negative voltage, the first storage device comprises a first capacitor coupled between the anode of the first Schottky diode and the first buffer, and the second storage device comprises a second capacitor coupled between the anode of the second Schottky diode and the second buffer.

* * * * *